United States Patent [19]
Kobayashi et al.

[11] 3,947,831
[45] Mar. 30, 1976

[54] WORD ARRANGEMENT MATRIX MEMORY OF HIGH BIT DENSITY HAVING A MAGNETIC FLUX KEEPER

[75] Inventors: Toshihiko Kobayashi, Mitaka; Tetsusaburo Kamibayashi, Niza, both of Japan

[73] Assignee: Kokusai Denshin Denwa Kabushiki Kaisha, Japan

[22] Filed: Sept. 23, 1974

[21] Appl. No.: 508,288

Related U.S. Application Data

[63] Continuation of Ser. No. 313,993, Dec. 11, 1972, abandoned.

[52] U.S. Cl. ............. 340/174 BC; 340/174 PW; 340/174 VA; 340/174 M
[51] Int. Cl.² ............................... G11C 11/155
[58] Field of Search 340/174 BC, 174 PW, 174 VA, 340/174 CC, 174 M

[56] References Cited
UNITED STATES PATENTS

| | | | |
|---|---|---|---|
| 3,274,571 | 9/1966 | Bobeck et al. | 340/174 BC |
| 3,376,561 | 4/1968 | Danylchuk | 340/174 M |
| 3,405,400 | 10/1968 | Rangachar | 340/174 BC |
| 3,413,617 | 11/1968 | Smith | 340/174 BC |
| 3,417,384 | 12/1968 | Blahut | 340/174 BC |
| 3,623,035 | 11/1971 | Kobayashi et al. | 340/174 BC |
| 3,665,428 | 5/1972 | Olyphant, Jr. | 340/174 BC |

*Primary Examiner*—Stanley M. Urynowicz, Jr.
*Attorney, Agent, or Firm*—Robert E. Burns; Emmanuel J. Lobato; Bruce L. Adams

[57] ABSTRACT

A word arrangement matrix memory of high bit density having a flux keeper is known in which a number of word lines provided on a flux keeper plate are mounted on the surface of a substrate on which a number of digit lines of magnetic strips each comprising a conductive strip coated with at least one ferromagnetic thin film is provided.

In accordance with this invention, the digit lines comprises a plurality of straight sections disposed in parallel at regular spaces, corresponding digit lines of the respective sections being interconnected to one another in series or in parallel. The flux keeper plate has, on the surface facing the said surface of the substrate, a number of parallel column grooves facing the sections of the digit lines and a number of parallel row grooves intersecting at right angles with the column grooves. The word lines comprise a plurality of X lines and a plurality of Y lines, the X lines and the Y lines being arranged so that only a group of memory cells on one of the digit line sections facing a position of the column grooves is selected by current coincidence selection of one of the X lines and one of the Y lines.

6 Claims, 6 Drawing Figures

WORD ARRANGEMENT MATRIX MEMORY OF HIGH BIT DENSITY HAVING A MAGNETIC FLUX KEEPER

This is a continuation, of application Ser. No. 313,993, filed Dec. 11, 1972, now abandoned.

This invention relates to a magnetic thin film memory and, more particularly, to a matrix memory of high bit density using a magnetic flux keeper.

In a matrix memory, the magnetic flux keeper serves to concentrate magnetic fluxes from dirve conductors to selected memory cells and to decrease magnetic fields disturbing adjacent memory cells. Accordingly, the use of the magnetic flux keeper enables narrowing of bit spacings to permit miniaturization of the apparatus and enlargement of its memory capacity and further raises the efficiency of a drive current to reduce power consumption. Hence, the magnetic flux keeper is widely used in the matrix memory and the like employing magnetic thin films.

In one example of a conventional apparatus of this kind, many digit lines coated with a magnetic material such as permalloy, serving as memory cells, are disposed side by side on a glass substrate, and groups of word lines inserted in grooves formed in a flux keeper plate are mounted on the digit lines in a manner to intersect the latter at right angles with the former. Further, a word drive pulse and a digit drive pulse are applied to the word lines and the digit lines respectively, thereby to store binary information in the magnetic material at each intersection of the both lines serving as a memory cell. To read out the stored information, the word drive pulse is applied only to the word lines to derive the read outputs from the digit lines.

In the case where the above mentioned apparatus is a matrix memory for practical use, that is, combined as a memory plane, it is necessary to provide terminals corresponding in number to the word and digit lines. The terminals required are so many that, only for housing them, the memory plane becomes dozens of times as large as the memory unit. Especially, as the pitch of the terminals becomes narrower, printed circuit boards, connector and so on for use in the plane become expensive, and their costs become scores of times higher than that of the memory unit. Therefore, the pitch of the terminals, and consequently the memory capacity is inevitably determined by the economic limit imposed by the cost of each component.

To avoid this, such a construction has also been adopted that a matrix circuit formed by diodes or transistors is used as a word selection matrix and arranged in the form of a memory plane, thereby to prevent an increase in the number of terminals of the memory plane. In this construction, however, it is necessary to mount the same number of diodes or transistors as that of the word lines on the memory plane. Further, even if an IC module presently available is employed, it is extremely large and expensive, as compared with the memory unit, so that it is very difficult to form the memory plane small in size and at low cost.

However, even if the memory unit may have been made high in bit density, the existing printed circuit boards, connectors and other parts cannot yet make the best use of such a memory unit of high bit density in terms of size and cost. Such is the present situation in the art.

Therefore, an object of the present invention is to provide a word arrangement matrix memory of high bit density capable of extremely reducing the number of connection terminals connected to external circuitry.

The principle, construction and operations of the present invention will clearly be understood from the following detailed description taken in conjunction with the accompanying drawings, in which.

Figure 1:
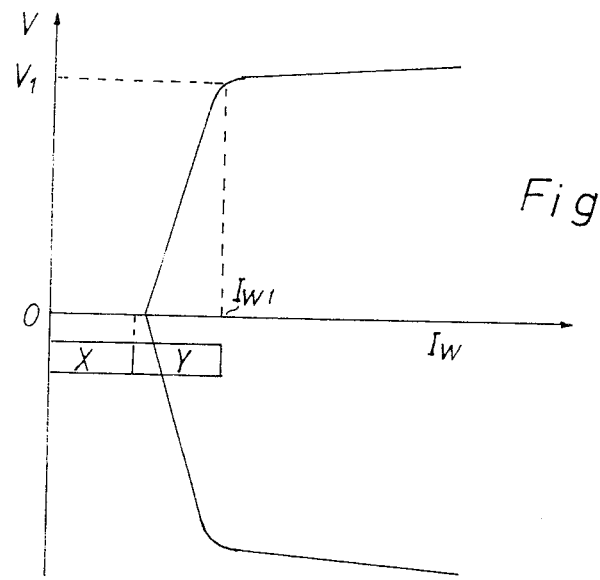
FIG. 1 is a characteristic diagram explanatory of the operational principle of this invention.

With reference to FIG. 1, the operational principle of this invention will be described. In FIG. 1, a characteristic curve shows the relationship between a word drive current $I_w$ and a readout output voltage V of the memory in the case where one pulse of a value $I_{w1}$ is applied to obtain an output $V_1$. If a magnetic flux keeper is associated with the word lines, magnetic fluxes caused by the applied magnetic field are thereby concentrated on a selected memory cell, so that the output voltage V fast rises up from a small value of the word drive current $I_w$ to the saturated value in accordance with the increase of the current $I_w$. Accordingly, if two pulses $x$ and $y$ each having a value equal to half the current $I_{w1}$ in view of the characteristic shown in FIG. 1 are employed as the word dirve current Iw, it is possible to achieve the so-called current coincidence selection so that only the memory cell to which the two pulses $x$ and $y$ are simultaneously applied is selected. Namely, no output is produced by only one of the half-selection pulses $x$ and $y$, while the write-in or read-out operation is achieved only in the memory cell to which the two pulses, $x$ and $y$ are simultaneously applied to provide a value of $I_{w1}$.

Figure 2:
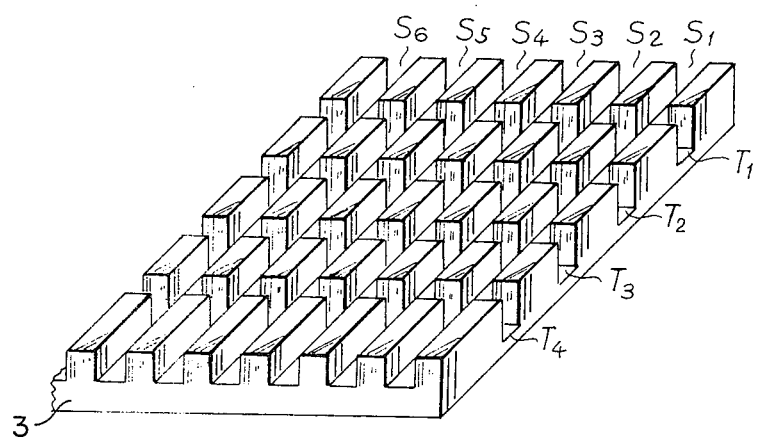
FIG. 2 is a perspective view illustrating an example of a magnetic flux keeper employed in this invention.

The present invention utilizes this principle. FIG. 2 is a perspective view illustrating an example of the construction of a flux keeper plate of ferrite for use in the present invention. In a conventional flux keeper plate having parallel column grooves $S_1, S_2, S_3, \ldots$ for receiving the word lines, parallel row grooves $T_1, T_2, T_3, \ldots$ are additionally formed so as to intersect with the column grooves $S_1, S_2, S_3, \ldots$ at right angles in predetermined intervals to divide each column groove into a plurality of column groove parts or segments each defined between a pair of next adjacent row grooves.

Figure 3:
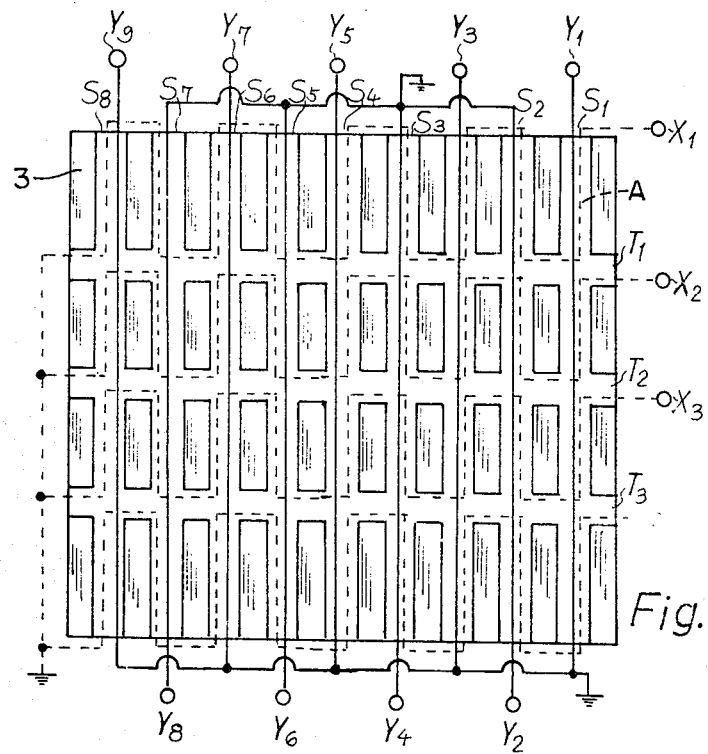
FIGS. 3 and 5 are plan views each illustrating an example of wiring of word lines used in this invention.

FIG. 3 is a diagram showing one example of the arrangement of drive lines so that the flux keeper plate 3 having such grooves as shown in FIG. 2 may have the selecting function of the current coincidence selection system. As illustrated in FIG. 3, Y lines ($Y_1, Y_2, Y_3, \ldots$) corresponding to conventional word lines are disposed in the column grooves $S_1, S_2, S_3, \ldots$, and each of X lines ($X_1, X_2, X_3, \ldots$) are disposed in a meandering line pattern to pass through adjacent pairs of the row grooves $T_1, T_2, T_3, \ldots$ and all the column grooves $S_1, S_2, S_3, \ldots$.

Figure 4:
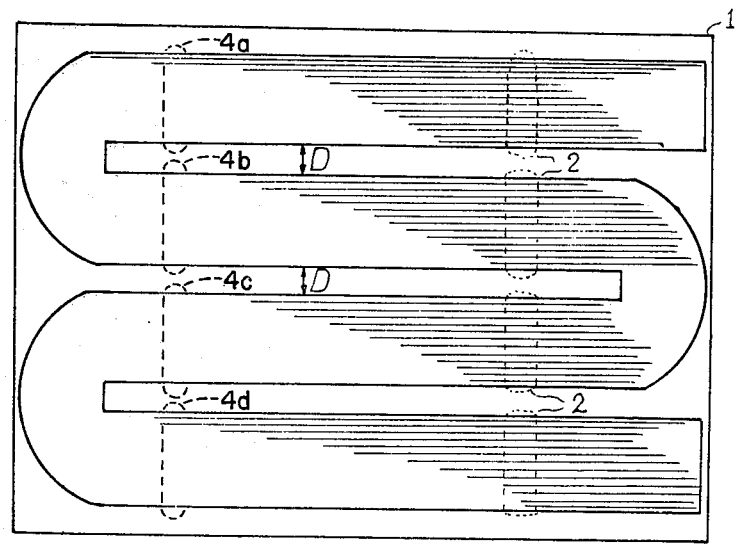
FIGS. 4 and 6 are plane views each illustrating an example of the pattern of digit lines for use in this invention.

FIG. 4 is a diagram illustrating the example of a group of parallel digit lines each coated with at least one magnetic thin film to provide memory cells therealong in combination with the flux keeper plate 3 of FIG. 3. A set of parallel digit lines corresponding in number to the word length is mounted on a substrate 1 in such a pattern as to be folded back at regular intervals D for the respective straight sections 4a, 4b, 4c, 4d of the digit line group 2. Further, the aforementioned flux keeper plate 3 is mounted on the substrate 1 to provide a memory and disposed, so that each wired part ($X_1, X_2, X_3 \ldots$) of the meander X line overlies one of the sections 4a, 4b, 4c, 4d of the digit line group 2, and so that the Y lines ($Y_1, Y_2, Y_3 \ldots$) with respect to respective sections 4a, 4b, 4c, 4d of the digit line group 2 at right angles. Similarly, the portions of each of the meandering X lines ($X_1, X_2, X_3 \ldots$) which lie within a column groove are disposed at right angles to the straight sections (4a–4d) of the digit lines which overlie the X lines. Accordingly, a group of word arrangement memory cells is provided on the digit line sections 4a, 4b, 4c, 4d facing each portion (e.g. A column groove part or segment) of the corresponding column groove $S_1, S_2, S_3, \ldots$ where the X line and the corresponding Y line run side by side. In the memory thus constructed, when the pulses x and y, each having a value equal to half that of the conventional word drive current $I_{wi}$ as described previously with regard to FIG. 1, are applied to, for example, lines $Y_1$ and $X_1$ of the Y and X lines respectively, only a group of memory cells formed by the plurality of digit line sections 4a facing a portion A where the lines $Y_1$ and $X_1$ run side by side, are excited while other groups of memory cells are not excited. Accordingly, it is possible to select a desired memory cell group on a desired digit line section 4a, 4b, 4c, 4d by coincidence of the X and Y lines utilizing the above principle. The outputs are derived from ends of the digit lines in group 2 having opposite ends grounded.

Figure 5:
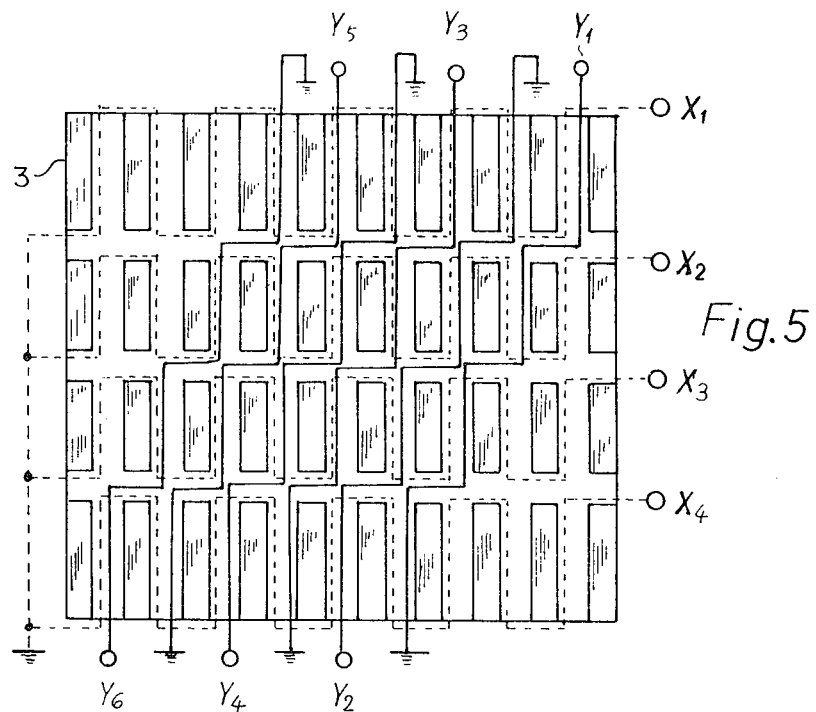

The arrangement of the X and Y lines are not limited specifically to that in the example of FIG. 3, but the Y lines may be arranged in a staircase pattern, for example, as illustrated in FIG. 5, so long as the arrangement enables selection of one memory cell section 4a, 4b, 4c, 4d on one digit line group by one X line and one Y line.

Figure 6:
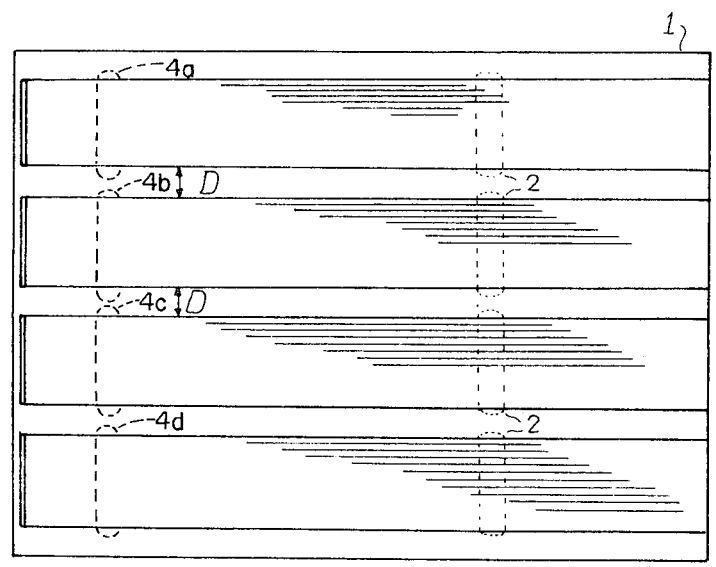

Further, the arrangement of the digit lines is not limited to that in which the respective sections 4a, 4b, 4c, 4d of the digit line group 2 are interconnected in series as shown in FIG. 4, but it may be such as shown in FIG. 6, in which the respective sections 4a, 4b, 4c, 4d of the digit line group 2 are arranged side by side, and in which corresponding ones of the digit lines of the sections 4a, 4b, 4c, 4d are interconnected in parallel with one another at the side of out-going lines.

In the foregoing description, the Y lines are arranged only in one direction but, in practice, the space factor can be further enhanced by folding back the Y lines at certain intervals. Further, the pitch of the grooves $S_1$, $S_2, S_3, \ldots$ in FIG. 3 is shown on the enlarged scale for facilitating the better understanding of explanation.

In accordance with the present invention, a selection matrix of the current coincidence selection system can be formed on the memory cells by means of forming grooves intersecting each other at right angles in the conventional keeper and providing the X lines in addition to the conventional Y lines, as has been described in the foregoing. Moreover, no special selection matrix such as a diode matrix or transistor matrix is not required any longer. Accordingly in addition to the reduction of the number of terminals down to $2\sqrt{n}$ of that of word lines n, the memory plane is made substantially as small as the memory cell unit and its cost is lowered. Moreover, since no connection of the word lines to selector circuits is required, reliability thereof increases. Further, since the amplitude of the pulse $I_{wi}$ is reduced by half, the current capacity of a word driver decreases and the word driver can be made small in size and at low cost. Moreover, the memory matrix can efficiently be formed with a required word length irrespective of the shape of the memory cell substrate and this provides remarked advantages such as a substantially enhanced memory density and the increased freedom in the manufacture of the memory cells.

What we claim is:

1. A high bit density word arrangement matrix memory comprising:
    a flat substrate of insulating material;
    a plurality of straight sections of parallel digit lines disposed in parallel at regular intervals on a flat surface of the flat substrate, each of the digit lines comprising a conductive strip and at least one ferromagnetic thin film disposed thereon, corresponding digit lines of the respective straight sections being interconnected to one another;
    a magnetic flux keeper plate of magnetic material having a plurality of parallel column grooves and a plurality of parallel row grooves intersecting at right angles with the parallel column grooves, the magnetic flux keeper plate being mounted on the flat substrate so that the column grooves and the row grooves are adjacent the flat surface of the flat substrate;
    a plurality of X conductors each disposed in a corresponding adjacent pair of the row grooves and having portions disposed in the segments of all the column grooves between said corresponding adjacent pair of row grooves so that each of the portions of the X conductors disposed in said segments of the column grooves overlies a corresponding one of the straight sections of the digit lines; and
    a plurality of Y conductors each disposed in at least a corresponding one of the column grooves.

2. A word arrangement matrix memory according to claim 1, in which the corresponding digit lines of the respective sections are interconnected to one another in series.

3. A word arrangement matrix memory according to claim 1, in which the corresponding digit lines of the respective sections are interconnected to one another in parallel.

4. A word arrangement matrix memory according to claim 1, in which each of the X lines are disposed in a meandering line pattern to alternately pass through respective portions of adjacent pairs of the corresponding row grooves and all the column grooves.

5. A word arrangement matrix memory according to claim 4, in which each of the Y lines is disposed in a single corresponding column groove.

6. A word arrangement matrix memory according to claim 4, in which each of the Y lines is disposed in a plurality of column grooves in a stepped pattern.

* * * * *